United States Patent
Sprafke

(10) Patent No.: US 10,910,291 B2
(45) Date of Patent: Feb. 2, 2021

(54) METHOD OF CREATING THERMAL BOUNDARY CONTROL

(71) Applicant: RAYTHEON COMPANY, Waltham, MA (US)

(72) Inventor: Thomas P. Sprafke, Santa Barbara, CA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 16/918,553

(22) Filed: Jul. 1, 2020

(65) Prior Publication Data

US 2020/0335419 A1    Oct. 22, 2020

Related U.S. Application Data

(62) Division of application No. 16/126,741, filed on Sep. 10, 2018, now Pat. No. 10,707,144.

(51) Int. Cl.
| | | |
|---|---|---|
| H01L 23/34 | (2006.01) | |
| H01L 23/373 | (2006.01) | |
| H01L 23/49 | (2006.01) | |
| H01L 23/31 | (2006.01) | |

(52) U.S. Cl.
CPC ...... *H01L 23/3735* (2013.01); *H01L 23/3114* (2013.01); *H01L 23/49* (2013.01)

(58) Field of Classification Search
CPC ... H01L 23/49; H01L 23/3114; H01L 23/3735
See application file for complete search history.

(56) References Cited

U.S. PATENT DOCUMENTS

| | | | |
|---|---|---|---|
| 6,879,016 B1 | 4/2005 | Skidmore et al. | |
| 8,377,373 B1 * | 2/2013 | Glennon | C22F 1/10 419/29 |
| 2011/0061901 A1 | 3/2011 | Lim et al. | |
| 2013/0100691 A1 | 4/2013 | Singer et al. | |
| 2013/0127008 A1 | 5/2013 | Poddar et al. | |
| 2013/0201741 A1 | 8/2013 | Tompkins et al. | |
| 2015/0373827 A1 | 12/2015 | Guo et al. | |
| 2016/0084905 A1 | 3/2016 | Ghanhi et al. | |
| 2016/0249458 A1 | 8/2016 | Tourne | |
| 2016/0270218 A1 | 9/2016 | Shibata et al. | |
| 2017/0309541 A1 * | 10/2017 | Kim | H01L 23/13 |
| 2019/0159293 A1 * | 5/2019 | Nosrati | H05B 3/03 |

FOREIGN PATENT DOCUMENTS

EP    0521720 A1    1/1993

OTHER PUBLICATIONS

ISR/WO, dated Jan. 2, 2020 RAY0397PCT, 12 pages total.

* cited by examiner

*Primary Examiner* — Phuc T Dang
(74) *Attorney, Agent, or Firm* — Cantor Colburn LLP

(57) ABSTRACT

A method of creating thermal boundaries in a substrate is provided. The method includes forming the substrate with first and second sections to be in direct thermal communication with first and second thermal elements, respectively, machining, in the substrate, first and second cavities for defining a third section of the substrate between the first and second sections and disposing a material having a characteristic thermal conductivity that is substantially less than that of the ceramic in the first and second cavities.

7 Claims, 6 Drawing Sheets

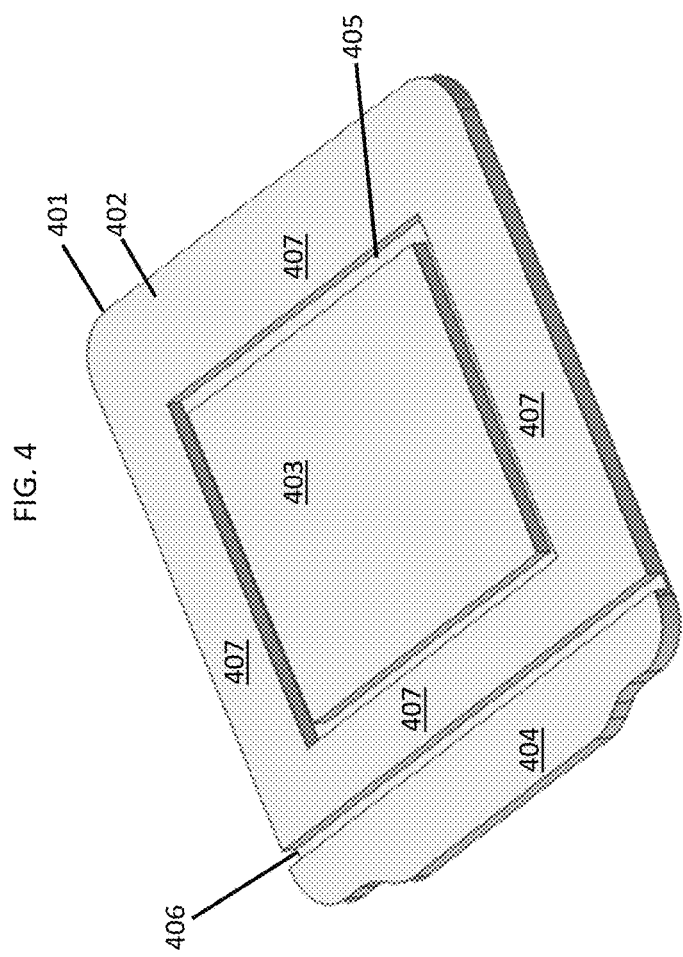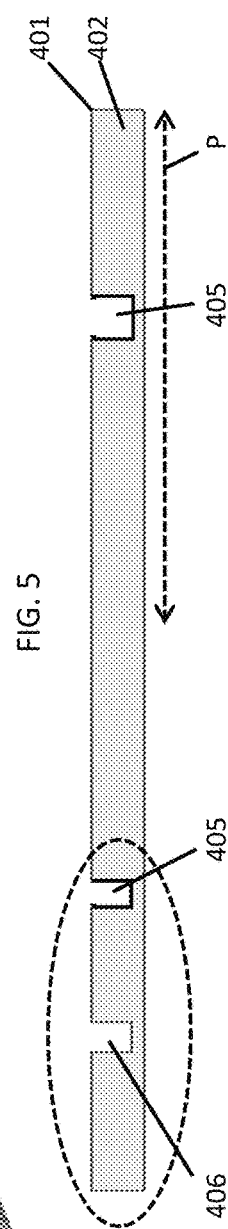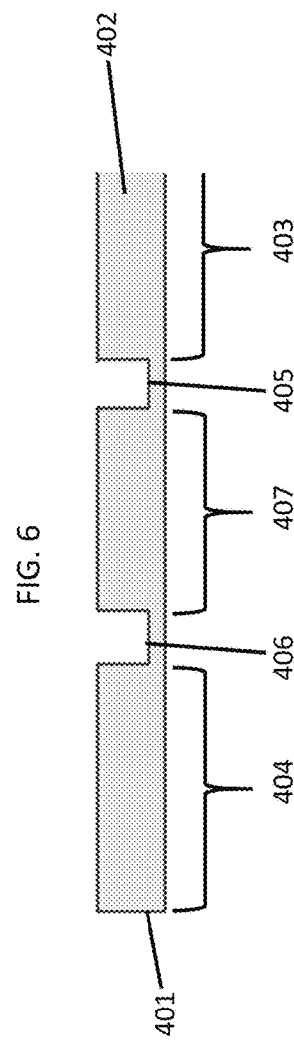

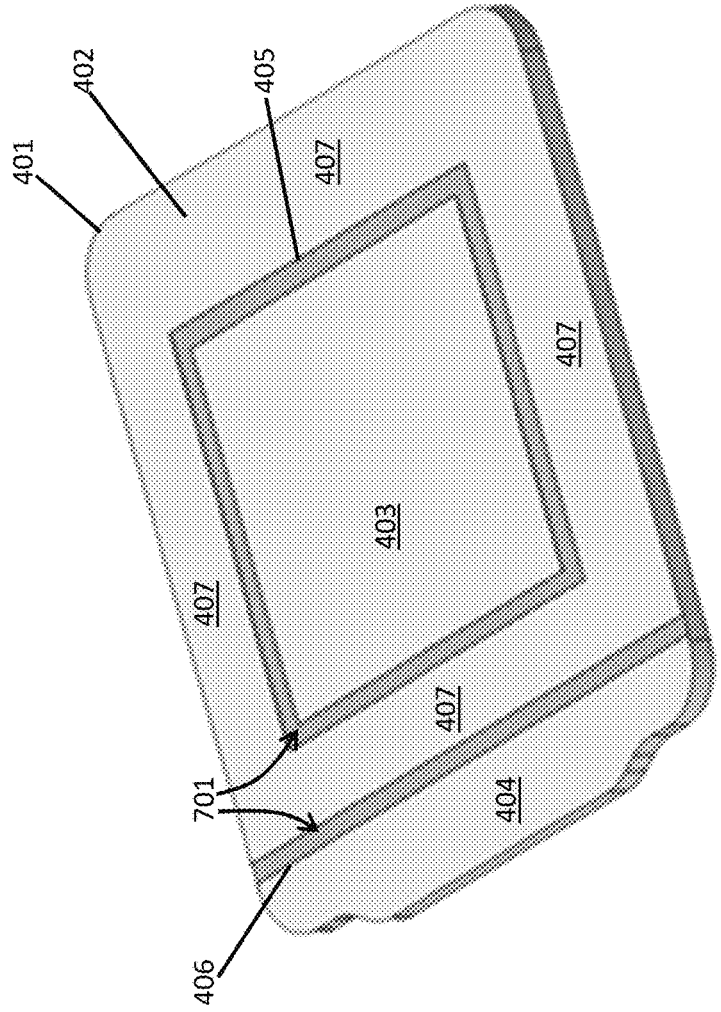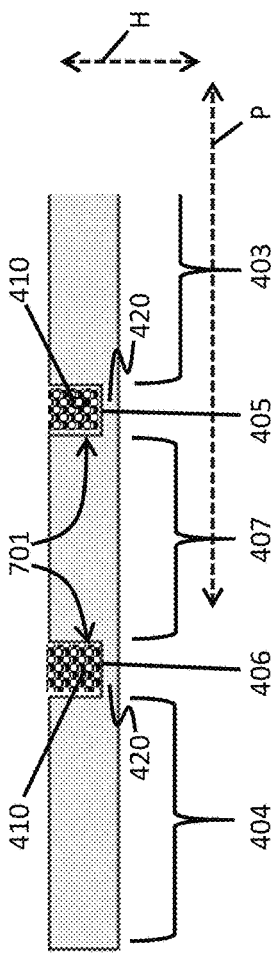

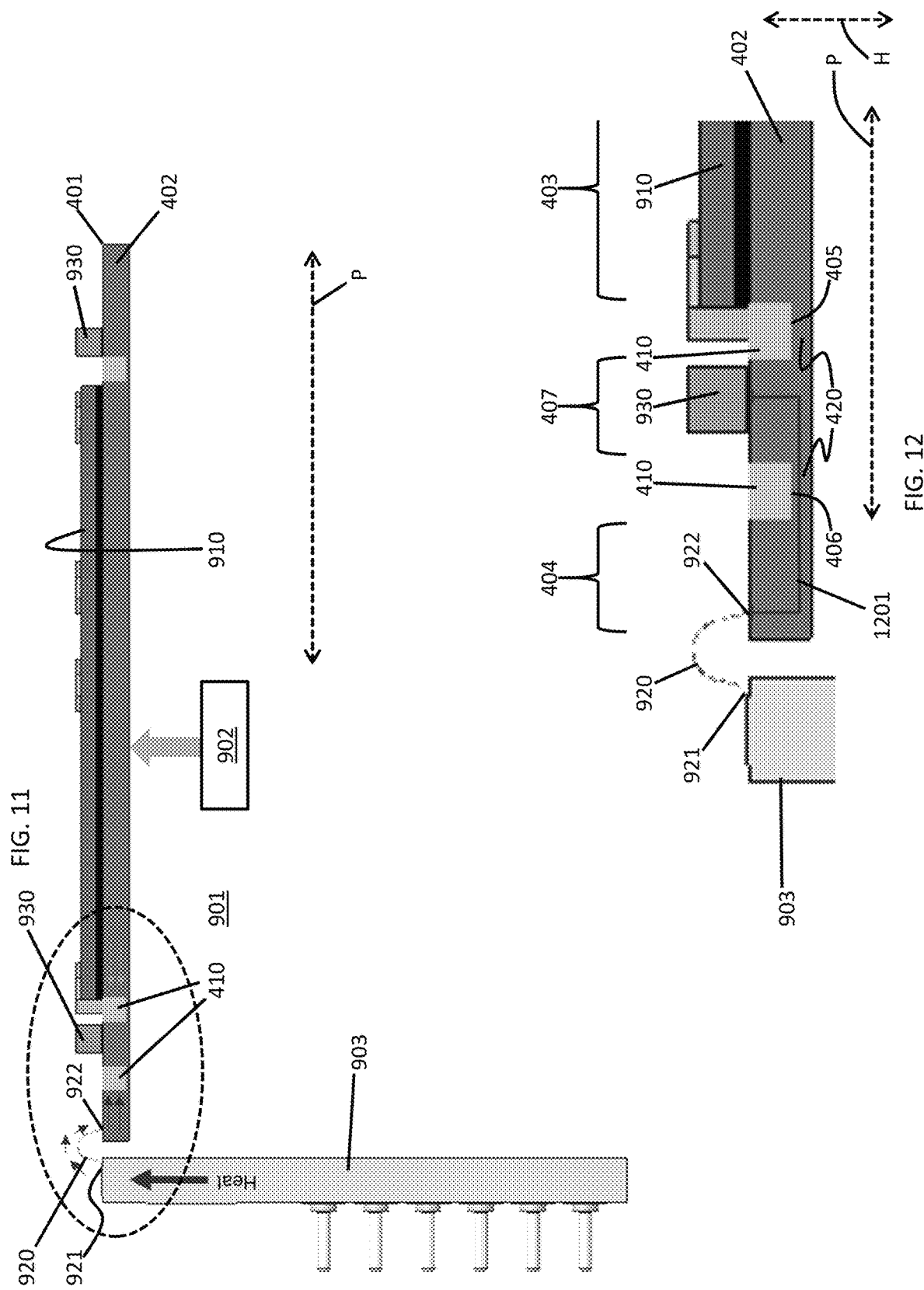

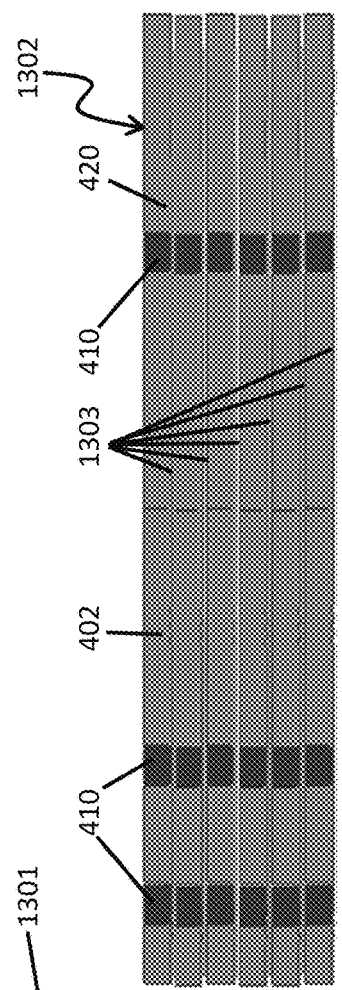
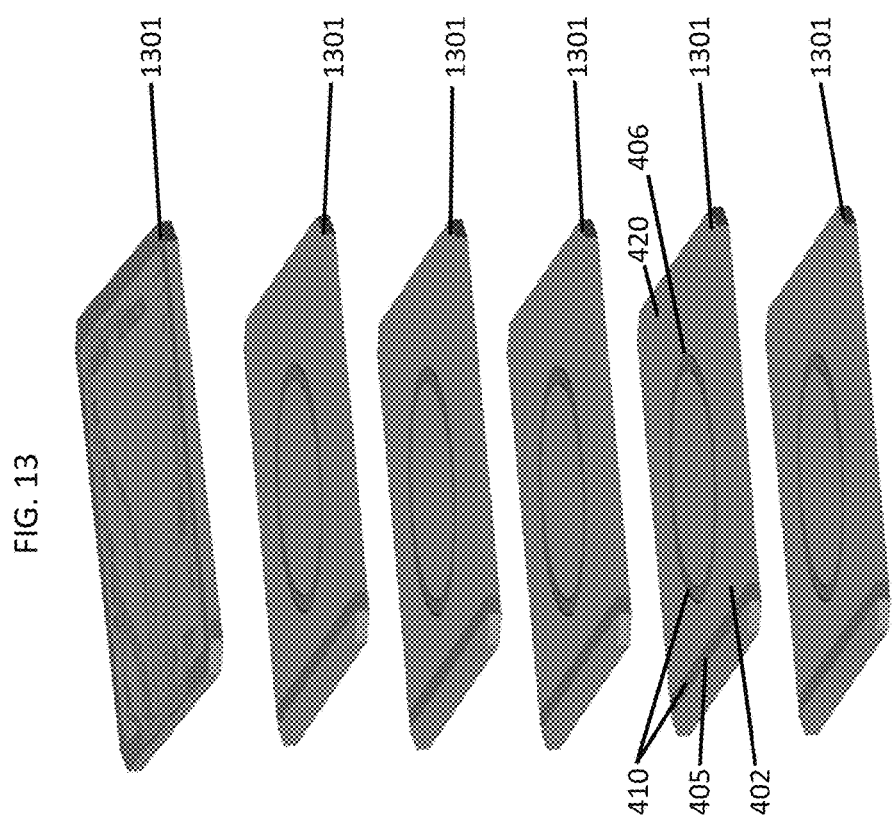
FIG. 13
FIG. 14

METHOD OF CREATING THERMAL BOUNDARY CONTROL

CROSS-REFERENCE TO RELATED APPLICATIONS

This application is a Divisional of Non-Provisional application Ser. No. 16/126,741 Filed Sep. 10, 2018, which is now issued as U.S. Pat. No. 10,707,144, the disclosure of which is incorporated herein by reference in its entirety.

BACKGROUND

The present disclosure relates to thermal boundary controls and, more particularly, to thermal boundary controls for substrates, such as substrates formed of isotropic ceramic materials.

A vacuum flask typically includes walls constructed from two or more layers with a vacuum maintained between the layers. This provides very good thermal insulation between an interior of the vacuum flask and an exterior. Vacuum flasks can be used to house temperature sensitive electronics in various applications, such as spaceflight assemblies. In vacuum flasks and other similar spaceflight assemblies, it is often necessary to provide for temperature control and heat management of ceramic, multi-layer boards, platforms and substrates.

For example, where a sensor chip assembly (SCA) configured to act as a detector is disposed on a circuit board of a vacuum flask, heat from external sources can leak into the SCA along wire bonds and affect detector performance. In addition, certain electrical components, such as capacitors, that are provided on SCA circuit boards are either "oversized" to negate effects of cold temperature operations or placed in warm spaces that affect their ability to be charged.

SUMMARY

According to one embodiment, a method of creating thermal boundaries in a substrate is provided. The method includes the substrate with first and second sections to be in direct thermal communication with first and second thermal elements, respectively, machining, in the substrate, first and second cavities for defining a third section of the substrate between the first and second sections and disposing a material having a characteristic thermal conductivity that is substantially less than that of the ceramic in the first and second cavities.

According to another embodiment, a substrate with thermal boundaries is provided. The substrate is formed with first and second sections to be in direct thermal communication with first and second thermal elements, respectively, and material. The substrate is formed to define first and second cavities and the first and second cavities define a third section of the substrate between the first and second sections. The material is disposed in the first and second cavities. The material has a characteristic thermal conductivity that is substantially less than that of the ceramic.

According to yet another embodiment, an assembly is provided with thermal isolation. The assembly includes first and second thermal elements at differing temperatures, a substrate formed with first and second sections in direct thermal communication with the first and second thermal elements, respectively, and material. The substrate is formed to define first and second cavities and the first and second cavities define a third section of the substrate between the first and second sections. The material is disposed in the first and second cavities and has a characteristic thermal conductivity that is substantially less than that of the ceramic.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts:

FIG. 4 is a perspective view of a substrate in which first and second cavities are machined in accordance with embodiments;

FIG. 5 is a side view of the substrate of FIG. 4;

FIG. 6 is an enlarged side view of the encircled portion of FIG. 5;

FIG. 7 is a perspective view of the substrate of FIG. 4 with co-cured or co-fired material disposed in the first and second cavities in accordance with embodiments;

FIG. 8 is an enlarged side view of the substrate with the co-cured or co-fired material of FIG. 7;

FIG. 11 is a side view of the assembly of FIG. 9;

FIG. 12 is an enlarged side view of the encircled portion of FIG. 11;

FIG. 13 is a perspective view of a layering of a substrate in accordance with embodiments; and FIG. 14 is a side view of a stack of layered substrates with electronic traces routed therein in accordance with embodiments.

DETAILED DESCRIPTION

As will be described below, thermal boundary controls are provided for substrates, such as those formed with isotropic ceramic materials, in particular, to improve temperature control and heat management of ceramic multilayer boards, platforms and substrates that are used in vacuum flasks and other similar spaceflight assemblies. The thermal boundary controls result from an infusion of titanium porcelain ceramic (TP ceramic) or other similar poor thermal conductors into cavities and pockets that are machined into ceramic substrates during a fabrication "Green State" and prior to co-firing processes. Such infusion of poor thermal conductors into homogeneous ceramic materials in turn creates thermal isolation boundaries between cold regions, such as SCAs, and warm sources, such as traces and wire bonds, on ceramic multilayer boards. The poor thermal conductors can also serve to reduce a Joule mass of a cryogenic SCA and to isolate temperature sensitive components, such as capacitors, from cryogenic systems.

Figure 1:
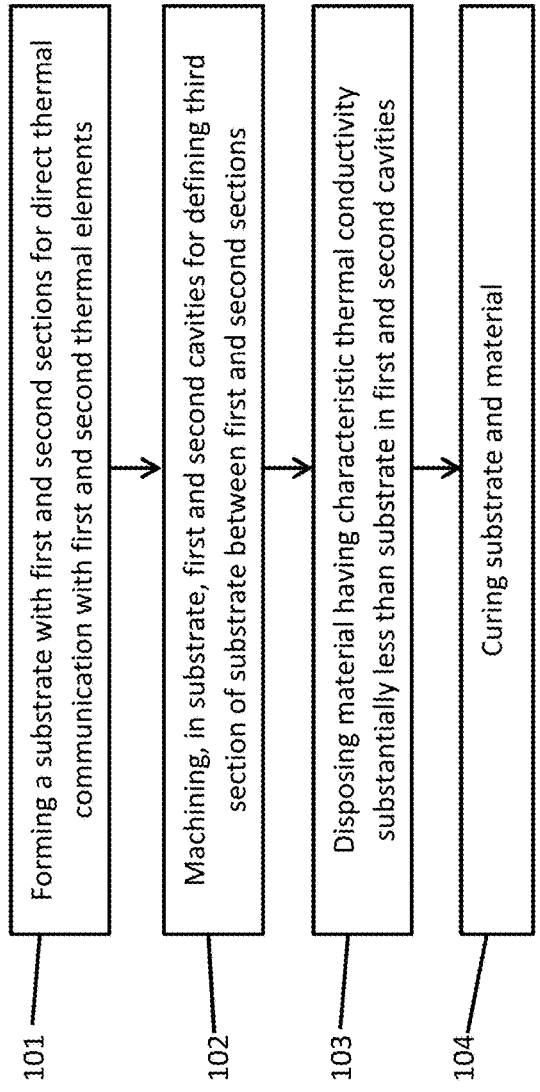
FIG. 1 is a flow diagram illustrating a method of creating thermal boundaries in a substrate in accordance with embodiments.
Figure 3:
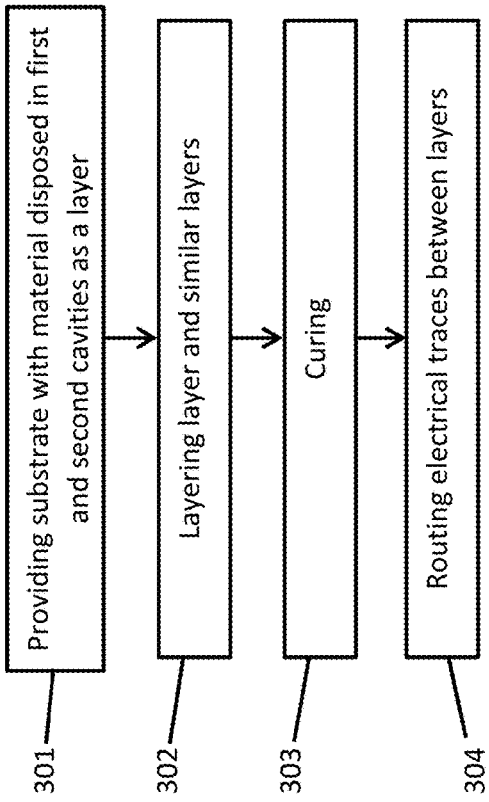
FIG. 3 is a flow diagram illustrating additional operations of the method of FIG. 1 in accordance with embodiments.
Figure 2:
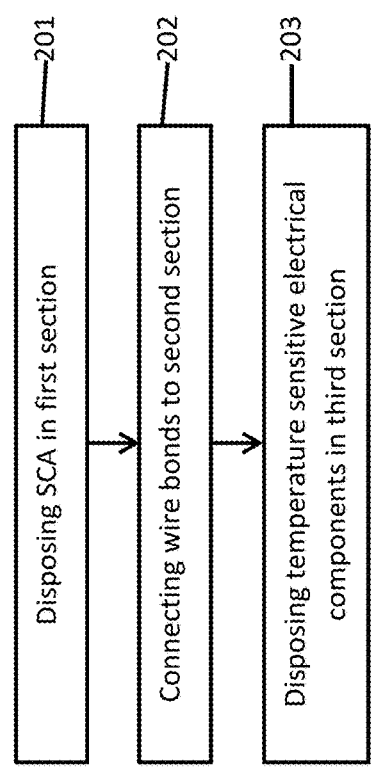
FIG. 2 is a flow diagram illustrating additional operations of the method of FIG. 1 in accordance with embodiments.

With reference to FIGS. 1-3, a method of creating thermal boundaries in a substrate, such as an isotropic ceramic substrate is provided.

As shown in FIG. 1, the method includes forming a substrate with first and second sections to be in direct thermal communication with first and second thermal elements, respectively (101) and machining, in the substrate, first and second cavities for defining a third section of the substrate between the first and second sections (102). The method also includes disposing a material having a characteristic thermal conductivity that is substantially less than that of the substrate in the first and second cavities (103) while the substrate is in a "Green" state and prior to the substrate being fired. The method additionally includes co-curing or co-firing both the substrate and the material at a substantially similar or same time (104).

In accordance with embodiments, the substrate can include a ceramic material of relatively high thermal conductivity, such as at least one of aluminum nitride and alumina, and the material disposed in the first and second cavities can include a material of relatively poor thermal conductivity, such as at least one of titanium porcelain, yttria, forsterite, cordierite, zirconia and steatite. In additional or alternative embodiments, the first section can be defined in a central region of the substrate with the first cavity surrounding the first section, the second section can be defined along a side of the substrate with the second cavity extending along the side of the substrate and the third section can surround the first section and extend along a side of the second section. The machining of the first and second cavities can be executed as a machining of a recess into the substrate to form a bridge, where the bridge is substantially thinner than the substrate and extends from one side thereof to another side thereof. In such cases, the method can further include routing electrical traces across the bridge.

In accordance with further embodiments and as shown in FIG. 2, the method can further include disposing a sensor chip assembly (SCA) in the first section (201), connecting wire bonds to the second section (202) and disposing temperature sensitive electrical components, which are electrically communicative with the SCA and the wire bonds, in the third section (203).

In accordance with further embodiments and as shown in FIG. 3, the method can further include providing the substrate with the material disposed in the first and second cavities as a layer (301), layering the layer in a stack with similar layers (302), co-curing or co-firing the ceramic and the material of each layer in the stack and routing electrical traces between adjacent layers in the stack (304).

With reference to FIGS. 4-8, a substrate, such as an isotropic ceramic substrate 401 (see FIG. 4) with thermal boundaries 701 (see FIG. 7) is provided.

As shown in FIGS. 4-6, the isotropic ceramic substrate 401 includes a substrate 402 that can be formed of ceramic or another similar material with a first section 403 and a second section 404. The first section 403 is defined and configured to be in direct thermal communication with a first thermal element in an assembly to be described below. The second section 404 is defined and configured to be in direct thermal communication with a second thermal element in the assembly. The substrate 402 is formed to define a first cavity 405 and a second cavity 406. The first cavity 405 and the second cavity 406 in turn define a third section 407 of the substrate 402. The third section 407 is disposed between the first section 403 and the second section 404 in a plane P (see FIG. 5) of the substrate 402.

As shown in FIGS. 7 and 8, material 410 is disposed in the first cavity 405 and in the second cavity 406 to form the thermal boundaries 701. The material 410 is co-cured or co-fired with the ceramic of the substrate 402 at a substantially similar or same time and has a characteristic thermal conductivity that is substantially less than that of the ceramic of the substrate 402.

In accordance with embodiments, the ceramic of the substrate 402 may include a material having a relatively high characteristic thermal conductivity (i.e., the ceramic of the substrate 402 is a good thermal conductor). In particular, the ceramic of the substrate 402 may include at least one of aluminum nitride (having a characteristic thermal conductivity of 150 W/m*K) and alumina (having a characteristic thermal conductivity of 32 W/m*K). The material 410 may have a relatively low characteristic thermal conductivity (i.e., the material 410 is a poor thermal conductor). In particular, the material 410 can include at least one of titanium porcelain (having a characteristic thermal conductivity of 15 W/m*K), yttria (having a characteristic thermal conductivity of 5 W/m*K), forsterite (having a characteristic thermal conductivity of 5 W/m*K), cordierite (having a characteristic thermal conductivity of 4 W/m*K), zirconia (having a characteristic thermal conductivity of 3 W/m*K) and steatite (having a characteristic thermal conductivity of 2 W/m*K).

As shown in FIGS. 4 and 5, the first section 403 may be defined in a central region of the substrate 402, the first cavity 405 may be arranged to surround a perimeter of the first section 403, the second section 404 may be defined along a side of the substrate 402 and the second cavity 406 may be arranged to extend along the side of the substrate 402. The third section 407 perimetrically surrounds the first cavity 405 and the first section 403 and extends along a side of the second cavity 406 and the second section 404.

As shown in FIG. 6, the substrate 402 may include a bridge 420 at each of the first cavity 405 and the second cavity 406. The bridge 420 is substantially thinner in a height dimension H, which is defined perpendicularly with respect to the plane P, than the substrate 402 at sections remote from the first and second cavities 405 and 406. The bridge 420 for the first cavity 405 extends from one side of the first cavity 405 to another side of the first cavity 405. The bridge 420 for the second cavity 406 extends from one side of the second cavity 406 to another side of the second cavity 406.

As shown in FIGS. 7 and 8, the material 410 disposed in the first and second cavities 405 and 406 serves as an effective block to thermal conduction along the plane P of the substrate 402. With the material 410 disposed in the first and second cavities 405 and 406, efficient heat transfer along the plane P is permitted or possible only along the bridges 420. As such, to an extent that the first section 403 of the substrate 402 is provided as a relatively cold or low temperature section and the second section 404 of the substrate 402 is provided as a relatively hot or high temperature section, the presence of the material 410 effectively thermally isolates the first and second sections 403 and 404 from one another. Moreover, the presence of the material 410 in the first cavity 405 and in the second cavity 406 effectively isolates the first section 403 and the second section 404 from the third section 407 of the substrate 402, respectively. As such, the third section 407 of the substrate 402 can be regarded as a warm or slightly cool section.

With reference to FIGS. 9-12, the substrate 402 of FIGS. 4-8 can be disposed in an assembly 901 to provide the assembly 901 with thermal isolation capability.

Figure 10:
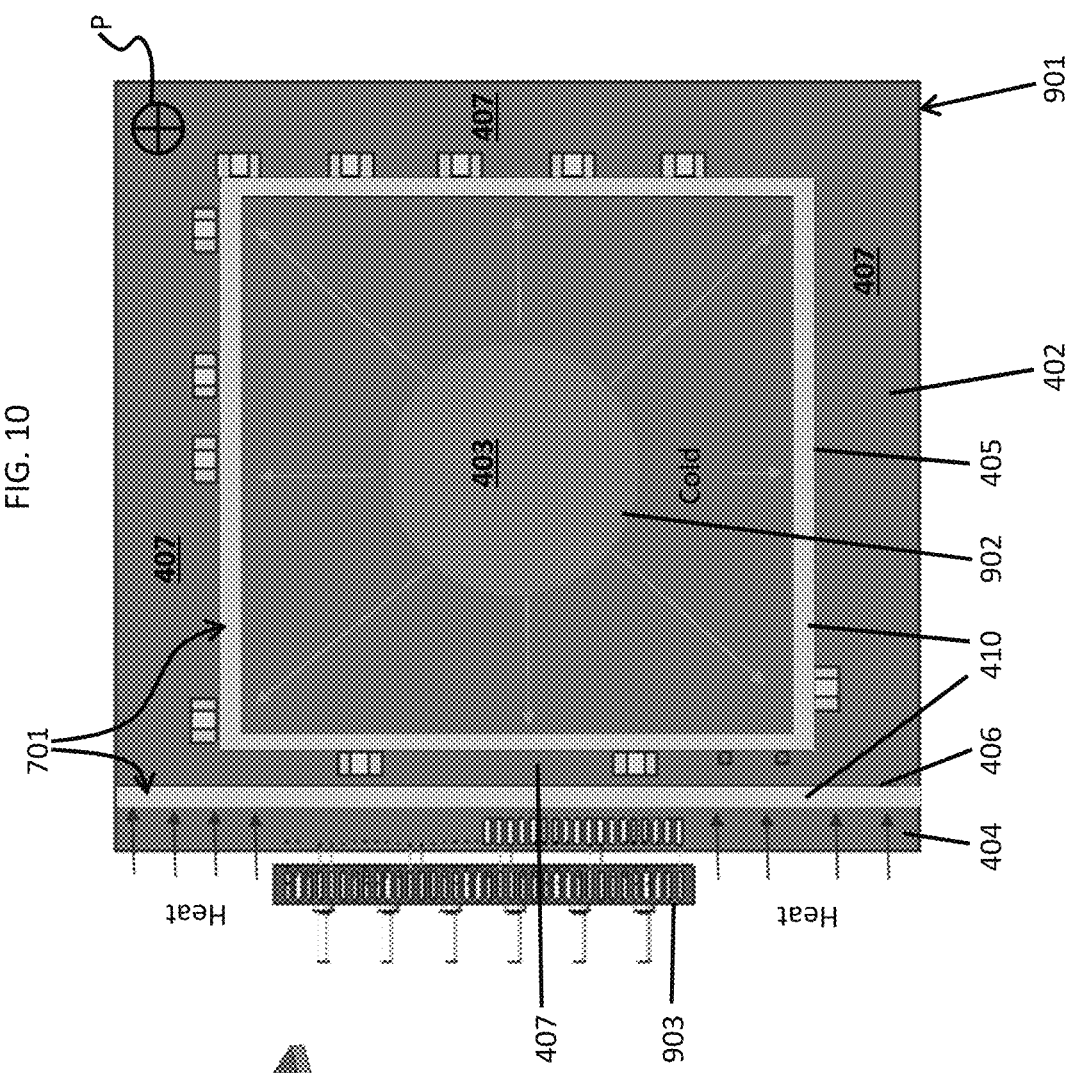
FIG. 10 is a top-down view of the assembly of FIG. 9.
Figure 9:
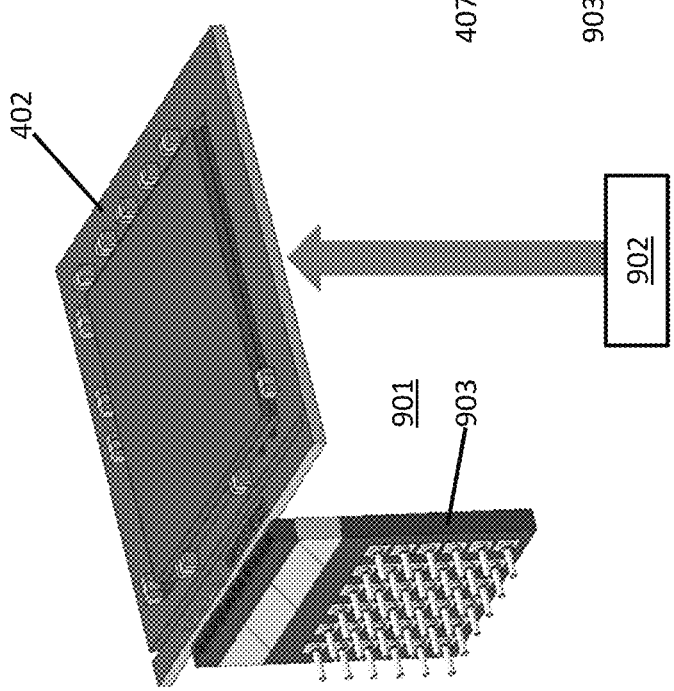
FIG. 9 is a perspective view of an assembly with thermal isolation in accordance with embodiments.

As shown in FIGS. 9 and 10, the assembly 901 includes a first thermal element 902 and a second thermal element 903. The first thermal element 902 may be provided as a cold source and has a characteristic low temperature and the second thermal element 903 may be provided as a hot source and has a characteristic high temperature. The substrate 402 is disposed in the assembly 903 such that the first section 403 is in direct thermal communication with the first thermal element 902 and such that the second section 404 is in direct thermal communication with the second thermal element 903. The presence of the material 410 in the first cavity 405 and in the second cavity 406 of the substrate 402 effectively isolates the first section 403 and the first thermal element 902 from the third section 407 of the substrate 402 and effectively isolates the second section 404 and the second thermal element 903 from the third section 407 of the substrate 402. As such, the third section 407 of the substrate 402 can be regarded in the assembly 901 as a warm or slightly cool section.

As shown in FIGS. 11 and 12, with the material 410 disposed in the first and second cavities 405 and 406, efficient heat transfer along the plane P of the substrate 402 is permitted or possible only along the bridges 420. As such, to an extent that the first section 403 of the substrate 402 is cold due to its thermal communication with the first thermal element 902 and the second section 404 of the substrate 402 is hot due to its thermal communication with the second thermal element 903, an efficient transfer of heat from the second section 404 to the third section 407 is permitted only across the corresponding bridge 420 and is thus limited by a substantial degree. Similarly, an efficient transfer of heat from the second section 404 to the first section 403 is limited by a greater substantial degree.

In accordance with embodiments, electrical traces 1201 (see FIG. 12) can be routed across the bridges 420. In addition, the assembly 901 can further include an SCA 910 disposed as a detector or another suitable device in the first section 403, wire bonds 920 that are connected between electrical components of a ceramic feed-through element 921 and pads 922 of the second section 404 and temperature sensitive electrical components 930. The temperature sensitive components 930 are disposed in the third section 407 where the temperature sensitive components 930 are not exposed to the cold of the first section 403 or the heat of the second section 404. Thus, the temperature sensitive components 930, which may include or be provided as capacitors that are electrically communicative with at least one of the SCA 910 and the wire bonds 920 by way of the electrical traces 1201, need not be oversized for a given application and are protected from degraded performance due to exposure to elevated temperatures.

In the embodiments in which the electrical traces 1201 are routed along the bridges 420, the electrical traces 1201 can extend from a surface of the substrate 402 into the substrate 402 in a depth direction to a depth of the bridges 1201, across a local portion of the substrate 402 and the bridges 420 at the depth and then toward the surface of the substrate 402 in the reverse-depth direction.

With reference to FIGS. 13 and 14, the substrate 402 with the material 410 disposed in the first and second cavities 405 and 406 can be provided as a layer 1301. This layer 1301 can then be layered, laminated or arranged in a stack 1302 with similar layers 1301. The ceramic of the substrate 402 and the material 410 of each layer 1301 in the stack 1302 is co-fired at a substantially similar or same time. In these or other embodiments, electrical traces 1303 (similar in function to the electrical traces 1201 of FIG. 12) can be routed between adjacent layers 1301 in the stack 1302.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A method of creating thermal boundaries in a substrate, the method comprising:
   forming the substrate with first and second sections to be in direct thermal communication with first and second thermal elements, respectively;
   machining, in the substrate, first and second cavities for defining a third section of the substrate between the first and second sections; and
   disposing a material having a characteristic thermal conductivity that is substantially less than that of the substrate in the first and second cavities.

2. The method according to claim 1, further comprising simultaneously curing the substrate and the material.

3. The method according to claim 1, wherein:
   the substrate comprises a ceramic of at least one of aluminum nitride and alumina, and
   the material comprises at least one of titanium porcelain, yttria, forsterite, cordierite, zirconia and steatite.

4. The method according to claim 1, wherein:
   the first section is defined in a central region of the substrate and the first cavity surrounds the first section,
   the second section is defined along a side of the substrate and the second cavity extends along the side of the substrate, and
   the third section surrounds the first section and extends along a side of the second section.

5. The method according to claim 1, wherein:
   the machining of the first and second cavities comprises machining a recess into the substrate to form a bridge,
   the bridge is substantially thinner than the substrate and extends from one side thereof to another side thereof, and
   the method further comprises routing electrical traces across the bridge.

6. The method according to claim 1, further comprising:
   disposing a sensor chip assembly (SCA) in the first section;
   connecting wire bonds to the second section; and
   disposing temperature sensitive electrical components, which are electrically communicative with the SCA and the wire bonds, in the third section.

7. The method according to claim 1, further comprising:
providing the substrate with the material disposed in the first and second cavities as a layer; and
layering the layer in a stack with similar layers.

* * * * *